(12) United States Patent
Niigaki et al.

(10) Patent No.: US 7,214,971 B2
(45) Date of Patent: May 8, 2007

(54) SEMICONDUCTOR LIGHT-RECEIVING DEVICE

(75) Inventors: Minoru Niigaki, Hamamatsu (JP); Kazutoshi Nakajima, Hamamatsu (JP)

(73) Assignee: Hamamatsu Photonics K.K., Shizuoka (JP)

( * ) Notice: Subject to any disclaimer, the term of this patent is extended or adjusted under 35 U.S.C. 154(b) by 57 days.

(21) Appl. No.: 10/864,797

(22) Filed: Jun. 10, 2004

(65) Prior Publication Data

US 2005/0051784 A1 Mar. 10, 2005

(30) Foreign Application Priority Data

Jun. 13, 2003 (JP) ............................ P2003-169643

(51) Int. Cl.
| | |
|---|---|
| H01L 29/32 | (2006.01) |
| H01L 31/0328 | (2006.01) |
| H01L 31/0336 | (2006.01) |
| H01L 31/072 | (2006.01) |
| H01L 31/109 | (2006.01) |

(52) U.S. Cl. ........................ 257/184; 257/10; 257/11; 257/21; 257/53; 257/54; 257/55; 257/56; 257/80; 257/81; 257/82; 257/83; 257/84; 257/85; 257/113; 257/114; 257/115; 257/116; 257/117; 257/118; 257/185; 257/186; 257/187; 257/188; 257/189; 257/225; 257/257; 257/258; 257/290; 257/291; 257/292; 257/293; 257/294; 257/414; 257/431; 257/432; 257/466; 257/749

(58) Field of Classification Search ............... 257/10, 257/11, 113–118, 21, 53–56, 80–85, 184–189, 257/225, 256, 257, 258, 290, 291, 294, 414, 257/431, 432, 437, 466, 749

See application file for complete search history.

(56) References Cited

U.S. PATENT DOCUMENTS

| | | | | |
|---|---|---|---|---|
| 3,737,701 A | * | 6/1973 | Hoeberechts et al. | 313/366 |
| 4,570,174 A | * | 2/1986 | Huang et al. | 257/266 |
| 4,719,498 A | * | 1/1988 | Wada et al. | 257/292 |
| 4,941,024 A | * | 7/1990 | Hayakawa et al. | 257/21 |
| 5,021,857 A | * | 6/1991 | Suehiro | 257/392 |
| 5,023,686 A | * | 6/1991 | Helmut et al. | 257/257 |
| 5,101,246 A | * | 3/1992 | Onodera | 257/82 |
| 5,333,141 A | * | 7/1994 | Wolf et al. | 372/20 |
| 5,471,076 A | * | 11/1995 | Murakami et al. | 257/184 |
| 5,569,933 A | * | 10/1996 | Chu et al. | 257/17 |
| 6,020,620 A | * | 2/2000 | Kusakabe | 257/436 |
| 6,229,165 B1 | * | 5/2001 | Sakai et al. | 257/291 |
| 6,232,141 B1 | * | 5/2001 | Kusakabe | 438/57 |
| 6,255,710 B1 | * | 7/2001 | Weitzel et al. | 257/501 |
| 6,359,919 B1 | * | 3/2002 | Ishikawa et al. | 372/45.01 |
| 6,445,020 B2 | * | 9/2002 | Fujimura | 257/225 |
| 6,686,616 B1 | * | 2/2004 | Allen et al. | 257/280 |

(Continued)

FOREIGN PATENT DOCUMENTS

EP 0162677 11/1985

(Continued)

*Primary Examiner*—Ida M. Soward
(74) *Attorney, Agent, or Firm*—Drinker Biddle & Reath LLP

(57) ABSTRACT

A semiconductor light-receiving device has a substrate including upper, middle and lower regions in its front side. A p-type layer on the lower region has a top surface including a portion on a level with the middle region. An electrode covers at least part of the boundary between the portion of the p-type layer and the middle region. An n-type layer on the p-type layer has a top surface including a portion on a level with the upper region. Another electrode covers at least part of the boundary between the portion of the n-type layer and the upper region.

9 Claims, 9 Drawing Sheets

U.S. PATENT DOCUMENTS

| | | |
|---|---|---|
| 6,690,079 B2 * | 2/2004 | Fujimura et al. ............ 257/460 |
| 6,791,124 B2 * | 9/2004 | Hiraoka et al. ............. 257/186 |
| 2003/0010993 A1 * | 1/2003 | Nakamura et al. ........... 257/99 |
| 2003/0085412 A1 * | 5/2003 | Nakamura et al. .......... 257/197 |
| 2003/0107108 A1 * | 6/2003 | Takagi ........................ 257/623 |
| 2003/0146441 A1 * | 8/2003 | Kawano et al. ............... 257/79 |
| 2003/0155625 A1 * | 8/2003 | Kato et al. .................. 257/432 |
| 2003/0160292 A1 * | 8/2003 | Takagi ........................ 257/432 |
| 2003/0218226 A1 * | 11/2003 | Ito et al. ..................... 257/431 |
| 2004/0026713 A1 * | 2/2004 | Tanoue et al. .............. 257/197 |
| 2004/0099888 A1 * | 5/2004 | Sriram ........................ 257/288 |
| 2005/0173712 A1 * | 8/2005 | Nakajima .................... 257/81 |

FOREIGN PATENT DOCUMENTS

| | | |
|---|---|---|
| JP | 60-163471 | 8/1985 |
| JP | 61-171176 | 8/1986 |
| JP | 62-65851 | 4/1987 |
| JP | 63-285971 | 11/1988 |
| JP | 02-105584 | 4/1990 |
| JP | 02-214160 | 8/1990 |
| JP | 11-307805 | 11/1999 |
| JP | 2002-163979 | 6/2002 |
| JP | 2002-214160 | 7/2002 |

* cited by examiner

SEMICONDUCTOR LIGHT-RECEIVING DEVICE

BACKGROUND OF THE INVENTION

1. Field of the Invention

The present invention relates to a semiconductor light-receiving device.

2. Related Background Art

A photoelectric transducer such as photodiode (PD) and avalanche photodiode (APD) has conventionally been produced by forming a semiconductor layer with a pn junction onto a p- or n-type semiconductor substrate having a high concentration by crystal growth, impurity diffusion, or the like. Recently, from the viewpoints of high light-receiving sensitivity and high-speed response, a semiconductor light-receiving device in which an electrode including a bonding pad to be electrically connected to an electrode is disposed on a semi-insulating substrate has been developed and put into practical use.

For example, Japanese Patent Application Laid-Open No. SHO 63-285971 discloses a semiconductor light-receiving device in which two kinds of semiconductor layers having respective characteristics different from each other are exposed onto the same plane of a semi-insulating substrate, so that electrodes can be arranged on a flat face. Such a semiconductor light-receiving device is useful from the viewpoint of lowering capacitance; however, it necessitates a special technique of forming recesses in two stages with slightly different depths on the flat face of the semi-insulating substrate, and etching back a semiconductor layer laminated on the recesses and a material with a characteristic different from the semiconductor layer, such as photoresist, at substantially the same speed.

As a technique for ameliorating the problem mentioned above, a semiconductor light-receiving device having two kinds of semiconductor layers whose crystals are grown in a mesa structure on the flat face of a semi-insulating substrate, and electrodes disposed at exposed parts of the semiconductor layer has been disclosed. For example, Japanese Patent Application Laid-Open No. HEI 2-105584 discloses such a semiconductor light-receiving device as a conventional example.

However, the technique described in HEI 2-105584 produces a steep step with the height corresponding to the thicknesses of the semiconductor layers on the substrate, though neither shaping the substrate nor special etching technique is required. Forming the electrodes on such a step may not only cause disconnection and poor insulation, but also require a complicated, difficult manufacturing process. As a result, thus produced semiconductor light-receiving device may lower its yield and reproducibility, whereby its reliability as a product may decrease.

SUMMARY OF THE INVENTION

In view of the foregoing circumstances, it is an object of the present invention to provide a semiconductor light-receiving device with improved yield and reproducibility.

A semiconductor light-receiving device comprises a semi-insulating substrate having a front side including upper, middle and lower regions. The lower region is connected to the upper and middle regions. A p-type first semiconductor layer is provided on the lower region. The first semiconductor layer has a top surface including a first portion adjoining and substantially on a level with the middle region, and a second portion on a level with or above the first portion. An n-type second semiconductor layer is provided on the first semiconductor layer. The second semiconductor layer has a top surface including a third portion adjoining and substantially on a level with the upper region, and a bottom surface. A first electrode covers at least part of a boundary between the middle region and the first portion. The first electrode is electrically in contact with the first semiconductor layer. A second electrode covers at least part of a boundary between the upper region and the third portion. The second electrode is electrically in contact with the second semiconductor layer.

The semi-insulating substrate may be made of semi-insulating GaAs, the first semiconductor layer p-type GaAs, and the second semiconductor layer n-type GaAs.

The semi-insulating substrate may be made of semi-insulating InP, the first semiconductor layer p-type $In_xGa_{1-x}As_yP_{1-y}$ ($0\leq x\leq 1$, $0\leq y\leq 1$), and the second semiconductor layer n-type $In_xGa_{1-x}As_yP_{1-y}$ ($0\leq x\leq 1$, $0\leq y\leq 1$).

The semiconductor light-receiving device may further comprise a third semiconductor layer interposed between the second portion of the first semiconductor layer and the bottom surface of the second semiconductor layer. The third semiconductor layer has a carrier concentration lower than those of the first and second semiconductor layers.

The semi-insulating substrate may be made of semi-insulating GaAs, the first semiconductor layer p-type GaAs, the second semiconductor layer n-type GaAs, and the third semiconductor layer i-type GaAs.

The semi-insulating substrate may be made of semi-insulating InP, the first semiconductor layer p-type $In_xGa_{1-x}As_yP_{1-y}$ ($0\leq x\leq 1$, $0\leq y\leq 1$), the second semiconductor layer n-type $In_xGa_{1-x}As_yP_{1-y}$ ($0\leq x\leq 1$, $0\leq y\leq 1$), and the third semiconductor layer i-type InGaAs.

The semi-insulating substrate may be made of semi-insulating InP, the first semiconductor layer p-type InAlAs, the second semiconductor layer n-type InAlAs, and the third semiconductor layer i-type InGaAs.

The semiconductor light-receiving device may further comprise a fourth semiconductor layer interposed between the second and third semiconductor layers. The fourth semiconductor layer has an energy bandgap greater than that of the third semiconductor layer.

The semi-insulating substrate may be made of semi-insulating GaAs, the first semiconductor layer p-type GaAs, the second semiconductor layer n-type GaAs, the third semiconductor layer i-type GaAs, and the fourth semiconductor layer i-type or n-type AlGaAs.

In this invention, the middle region and the first portion may be connected to form a flat face. The upper region and the third portion may also be connected to form a flat face.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 2A–2C are schematic views showing manufacturing steps of the semiconductor light-receiving device in accordance with the first embodiment, in which FIGS. 2A and 2B are views showing a recess forming step, whereas FIG. 2C is a view showing a laminating step.

DESCRIPTION OF THE PREFERRED EMBODIMENTS

Figure 1A:
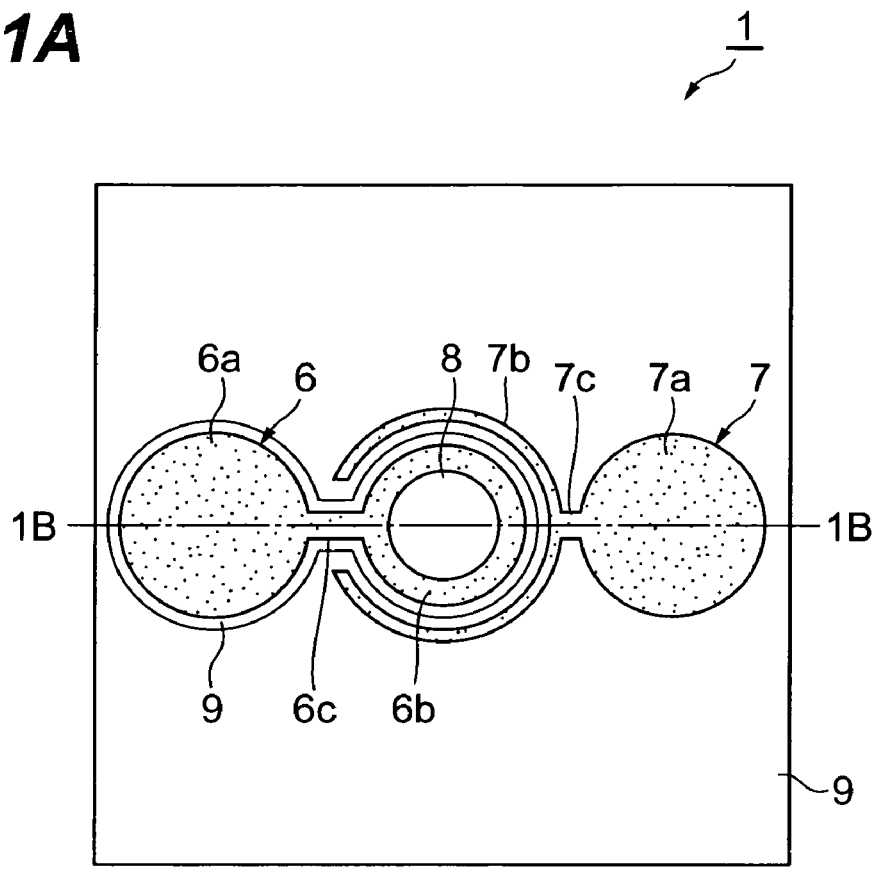
FIG. 1A is a top plan view of the semiconductor light-receiving device in accordance with the first embodiment of the present invention.

The preferred embodiments of the present invention will be described below in greater detail with reference to the accompanying drawings. To facilitate understanding, identical reference numerals are used, where possible, to designate identical or equivalent elements that are common to the embodiments, and, in subsequent embodiments, these elements will not be further explained.

First Embodiment

Figure 1B:
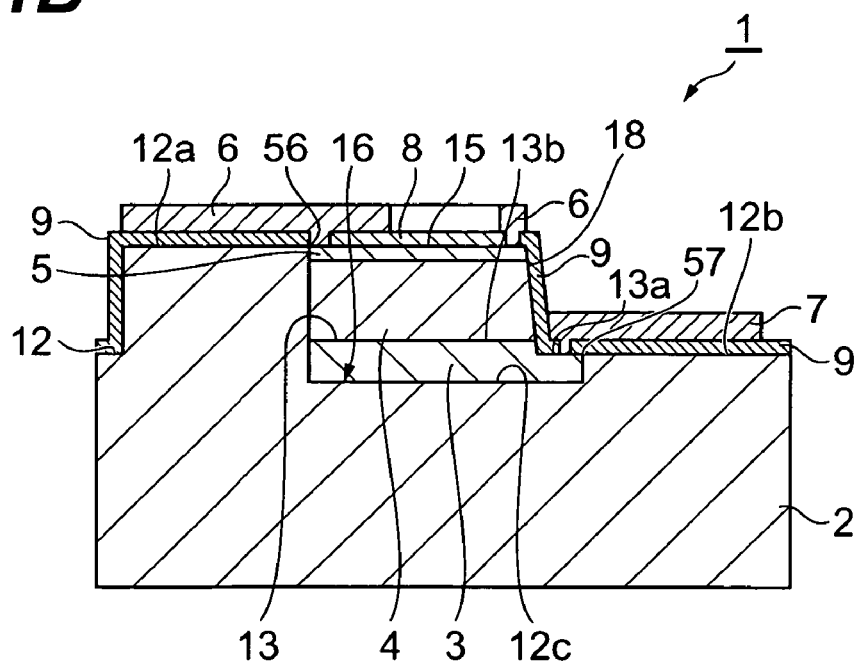
FIG. 1B is a sectional view taken along line 1B—1B in FIG. 1A.

FIGS. 1A and 1A are views for explaining the semiconductor light-receiving device 1 in accordance with the first embodiment of the present invention, in which FIG. 1A is a schematic top plan view of the light-receiving device, whereas FIG. 1B is a schematic sectional view taken along the dash-single-dot line 1B—1B in FIG. 1A.

First, the configuration of the light-receiving device 1 will be explained. As shown in FIG. 1B, a semi-insulating GaAs substrate 2 has the front side 12 including three regions 12a, 12b and 12c with different heights, which are hereinafter referred to as "upper region", "middle region" and "lower region" according to their heights. The height decreases in the order of upper, middle and lower regions, whereas the difference in height between the upper and middle regions is on the order of 1 to 5 μm (preferably 2.5 μm). The difference in height between the middle and lower regions is on the order of 0.1 to 2 μm (preferably 0.5 μm). The regions 12a–12c are formed so that the upper and middle regions 12a and 12b hold the lower region 12c therebetween horizontally (i.e., the lower region 12c is connected between the upper and middle regions 12a and 12b). Consequently a recess 16 is formed at the central portion of the substrate 2.

The recess 16 has a bottom surface defined by the lower region 12c, and a side wall formed by part of the step between the lower and upper regions 12c and 12a and the step between the lower and middle regions 12c and 12b. The depth from the upper region 12a to the lower region 12c in the recess 16 is on the order of 1 to 7 μm (preferably 3 μm).

The recess 16 is filled with a p-type GaAs layer 3 by a deposition process. The p-type GaAs layer 3 has a thickness on the order of 0.5 to 2 μm (preferably 1 μm) and contains a first impurity. Preferably, the p-type GaAs layer 3 has a carrier concentration of $1 \times 10^{20}$ cm$^{-3}$ or greater.

The top surface 13 of the p-type GaAs layer 3 includes two portions 13a and 13b with different heights. The portion 13a with a lower height (hereinafter referred to as "first portion") is substantially on a level with and adjoins the middle region 12b. Accordingly, the first portion 13a and the middle region 12b form a flat face near the boundary 57 therebetween. As a consequence, a p-side ohmic electrode 7, which will be explained later, can be disposed over the flat face, whereby the disconnection and poor insulation caused by the deterioration in coverage is suppressed as compared with that in the case where the electrode is disposed over a step.

On the other hand, the portion 13b with a higher height (hereinafter referred to as "second portion") is formed on the side of the upper region 12a. The second portion 13b is higher than the middle region 12b by about 0.2 to 1 μm (preferably 0.5 μm).

An i-type GaAs layer 4 as a light-absorbing layer is laminated directly on the second portion 13b of the p-type GaAs layer 3 to fully cover the second portion 13b. The i-type GaAs layer 4 has a thickness on the order of 0.5 to 5 μm (preferably 2 μm).

Further, directly on the i-type GaAs layer 4, an n-type GaAs layer 5 having a thickness on the order of 0.005 to 0.05 μm (preferably 0.02 μm) and containing a second impurity is laminated to fully cover the top surface of the i-type GaAs layer 4. Preferably, the n-type GaAs layer 5 has a carrier concentration of $1 \times 10^{18}$ cm$^{-3}$ or greater.

The GaAs layers are successively laminated in the order of p-type GaAs layer 3, i-type GaAs layer 4, and n-type GaAs layer 5, whereas their total thickness is about 3 μm, which equals to the difference in height between the upper and lower regions 12a and 12c. That is, the n-type GaAs layer 5 has a flat top surface 15 adjoining and substantially on a level with the upper region 12a of the semi-insulating GaAs substrate 2. Accordingly, the top surface 15 and the upper region 12a form a flat face near the boundary 56 therebetween. When an n-side ohmic electrode 6, which will be explained later, is disposed over at least part of the boundary 56, the coverage can be improved, thereby preventing the disconnection and poor insulation.

The i-type GaAs layer 4 has a carrier concentration lower than those of the p-type and n-type GaAs layers 3 and 5 and a thickness on the order of 0.5 to 5 μm, preferably 2 μm, defining the thickness of the depletion region contributing to the optical absorption. Setting the layer thickness to an optimal value with respect to the optical absorption length determined by the wavelength of the incident light can realize a semiconductor light-receiving device 1 with a high light-receiving sensitivity.

The GaAs layers 3–5 form a step 18 (i.e., the cliff-like side wall in the drawing) due to the difference in height between the upper and lower regions 12a and 12c. This step 18 is covered with an insulating film 9 for maintaining the voltage resistance of the device 1 and preventing it from short-circuiting. The insulating film 9 also covers the upper and middle regions 12a and 12b of the semi-insulating GaAs substrate 2 and the first portion 13a of the p-type GaAs layer 3. An antireflection film 8 is formed so as to cover the central portion of the top surface 15 of the n-type GaAs layer 5.

The n-side ohmic electrode 6 is formed on the n-type GaAs layer 5 after partly eliminating the antireflection film 8. The n-side electrode 6 is mounted on the upper region 12a of the semi-insulating GaAs substrate 2 with the insulating film 9 interposed therebetween. The n-side electrode 6 covers part of the boundary 56 and extends like a bridge from the upper region 12a to the top surface 15 of the n-type GaAs layer 5 with the antireflection film 8 interposed between the electrode 6 and the layer 5. As shown in FIG. 1A, the n-side electrode 6 has a circular portion 6a on the upper region 12a, a ring portion 6b around the antireflection film 8 on the top surface 15 of the n-type GaAs layer 5, and a strip portion 6c extending between the portions 6a and 6b. The n-side ohmic electrode 6 is electrically in contact with the n-type GaAs layer 5 so as to fill the gap between the antireflection film 8 and the insulating film 9 on the top surface 15 of the n-type GaAs layer 5.

The p-side ohmic electrode 7 is formed on the p-type GaAs layer 3 after partly eliminating the insulating film 9. The p-side electrode 7 is mounted on the middle region 12b of the semi-insulating GaAs substrate 2 with the insulating film 9 interposed therebetween. The p-side electrode 7 covers part of the boundary 57 and extends like a bridge from the middle region 12b to the first portion 13a of the p-type GaAs layer 3 with the insulating film 9 interposed between the electrode 6 and the layer 3. As shown in FIG. 1A, the p-side ohmic electrode 7 is located at a position opposing the n-side ohmic electrode 6 across the portion where the semiconductor layers are laminated (i.e., on the middle region 12b of the semi-insulating GaAs substrate 2). The p-side electrode has a circular portion 7a with substantially the same diameter as that of the circular portion 6a of the n-side ohmic electrode 6. On the top surface 13 of the p-type GaAs layer 3, the p-side ohmic electrode 7 has a C-shape portion 7b surrounding the ring portion 6b of the n-side ohmic electrode 6 with a predetermined gap therebetween. The p-side electrode 7 also has a strip portion 7c extending between the portions 7a and 7b. The p-side ohmic electrode 7 is electrically in contact with the p-type GaAs layer 3 so as to fill the through hole of the insulating film 9 formed on the top surface 13 of the p-type GaAs layer 3. Except for this contact, the p-side ohmic electrode 7 is not electrically connected with the p-type GaAs layer 3.

The p-side and n-side ohmic electrodes 6 and 7 are connected to a driving power supply (not depicted) by way of leads (not depicted). The cliff-like side wall 18 formed by the GaAs layers 3–5 is covered with the insulating film 9 alone, and no ohmic electrodes are in contact with the side wall 18.

Figure 2A:
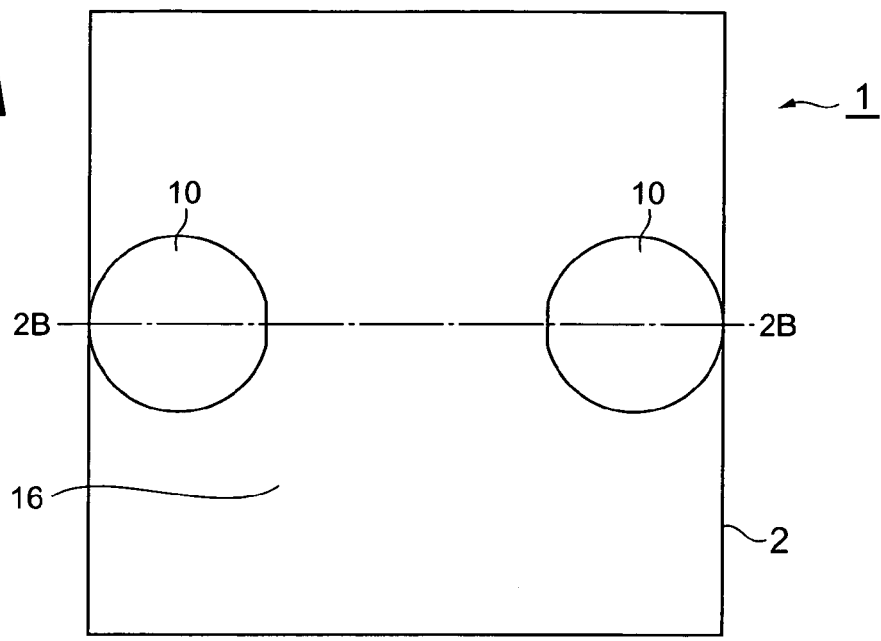
Figure 2B:
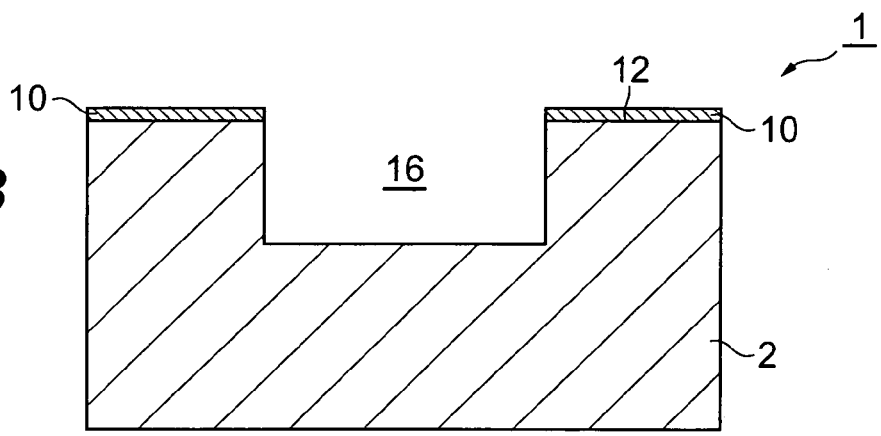
Figure 2C:
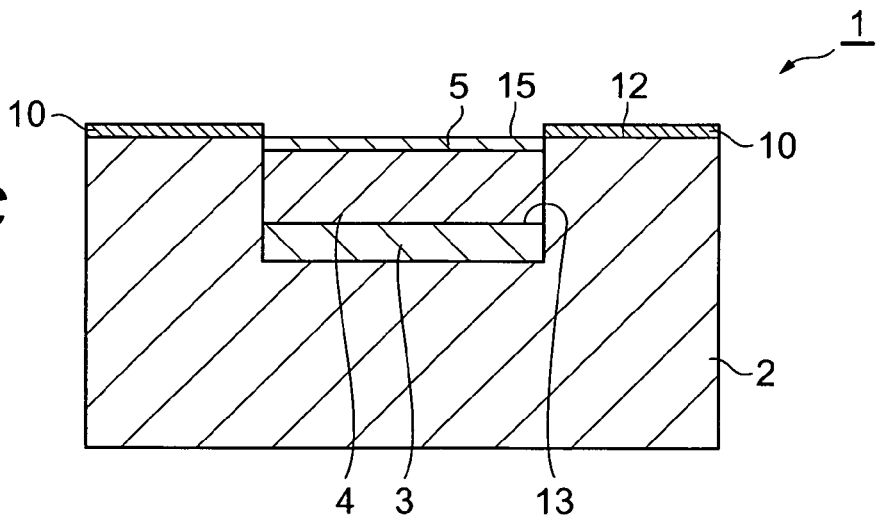

A method of making the semiconductor light-receiving device 1 will now be explained. FIGS. 2A–2C are schematic sectional views showing manufacturing steps of the semiconductor light-receiving device 1 in accordance with the first embodiment of the present invention. First, by a thin film growing technique such as plasma CVD (Chemical Vapor Deposition), a silicon oxide film is deposited as a selective growth protective film 10 on a semi-insulating GaAs substrate 2. Subsequently, by using a photolithography technique, the selective growth protective film 10 is selectively etched so that the front side 12 of the semi-insulating GaAs substrate 2 is partly exposed. Then, the semi-insulating GaAs substrate 2 is dipped into a mixed solution produced with a predetermined composition ratio so that only the exposed part of the front side 12 is chemically etched. As a result, the semi-insulating GaAs substrate 2 attains the form shown in FIG. 2A, which is a schematic top plan view, and FIG. 2B, which is a schematic sectional view taken along line 2B—2B in FIG. 2A.

Next, by a crystal growing technique such as MOCVD (Metal Organic Chemical Vapor Deposition), a p-type GaAs layer 3, an i-type GaAs layer 4, and an n-type GaAs layer 5 are successively deposited and grown on the semi-insulating GaAs substrate 2. In this step, the selective growth protective film 10 prevents the crystals from growing on the substrate surface, whereby the GaAs layers continuously grow only in the recess 16 of the semi-insulating GaAs substrate 2. This yields a state in which the p-type, i-type and n-type GaAs layers fill the recess 16 of the semi-insulating GaAs substrate 2 like a laminate as shown in FIG. 2C, which is a schematic sectional view. When the depth by which the semi-insulating GaAs substrate 2 is etched equals to the total thickness of the crystal-growing GaAs layers, the front side 12 and the top surface of the layer 5 form a flat face.

Subsequently, the selective growth protective film 10 is eliminated. Then, by using a photolithography technique, the crystal-growing layers 3, 4, 5 and semi-insulating GaAs substrate 2 are partly etched until the top surface 13 of the p-type GaAs layer 3 is partly exposed. This forms cliff-like semiconductor layers in the area including the recess 16 of the semi-insulating GaAs substrate 2. After the semiconductor layers are formed, a silicon nitride film ($Si_3N_4$) is deposited on the n-type GaAs layer 5 by a crystal growing technique such as plasma CVD so as to produce an antireflection film 8.

Similarly, the semi-insulating GaAs substrate 2 is coated with a silicon nitride film so as to form an insulating film 9 as a surface protection film, and the step 18 of the semiconductor layer is coated with a silicon nitride film so as to form the insulating film 9 as a side wall protection film. The antireflection film 8 and insulating film 9 are not required to be formed separately. A silicon nitride film deposited by a single plasma CVD step can act as an antireflection film or insulating film depending on its position. Then, a p-side ohmic electrode 7 and an n-side ohmic electrode 6 are deposited like thin films by vacuum evaporation and patterned so as to touch the exposed parts of the p-type GaAs layer 3 and n-type GaAs layer 5, respectively. As a result, the semiconductor light-receiving device 1 having the cross-sectional form shown in FIG. 1B is obtained.

Figure 3:
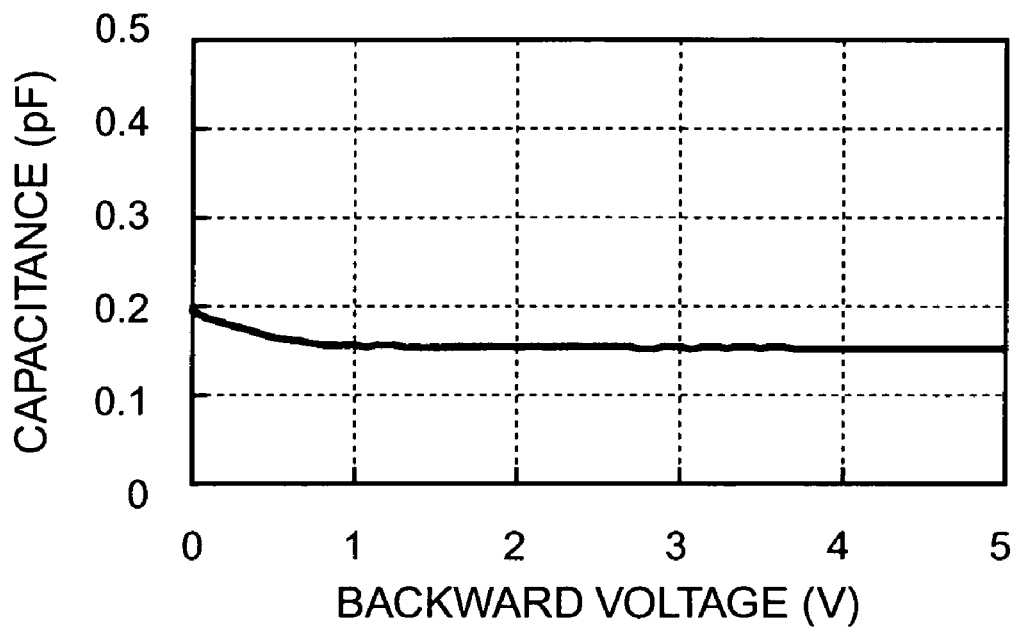
FIG. 3 is a graph showing an example of the capacitance-backward voltage characteristic of the semiconductor light-receiving device in accordance with the first embodiment.
Figure 4:
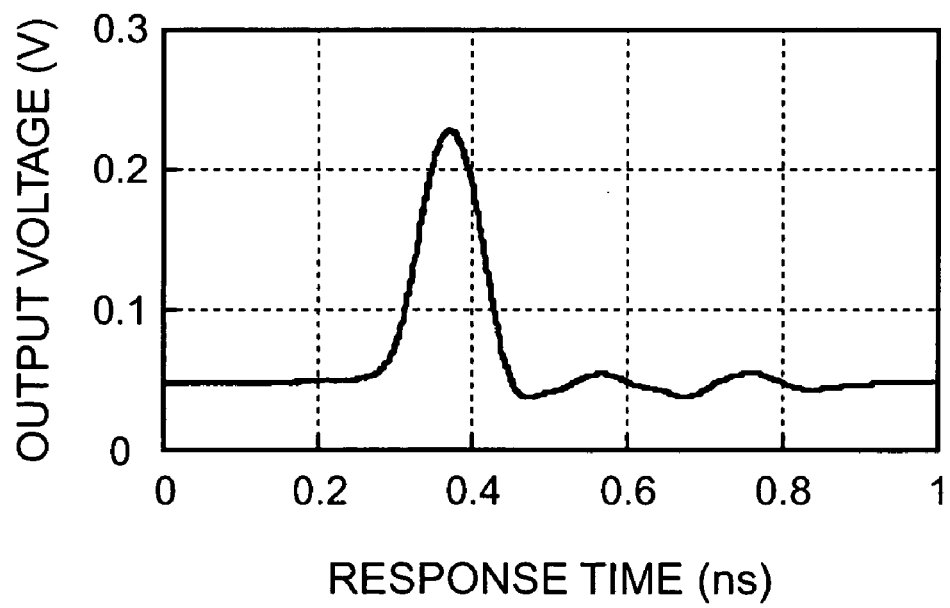
FIG. 4 is a graph showing an example of the electric output waveform in response to an optical pulse input in the semiconductor light-receiving device in accordance with the first embodiment.
Figure 5:
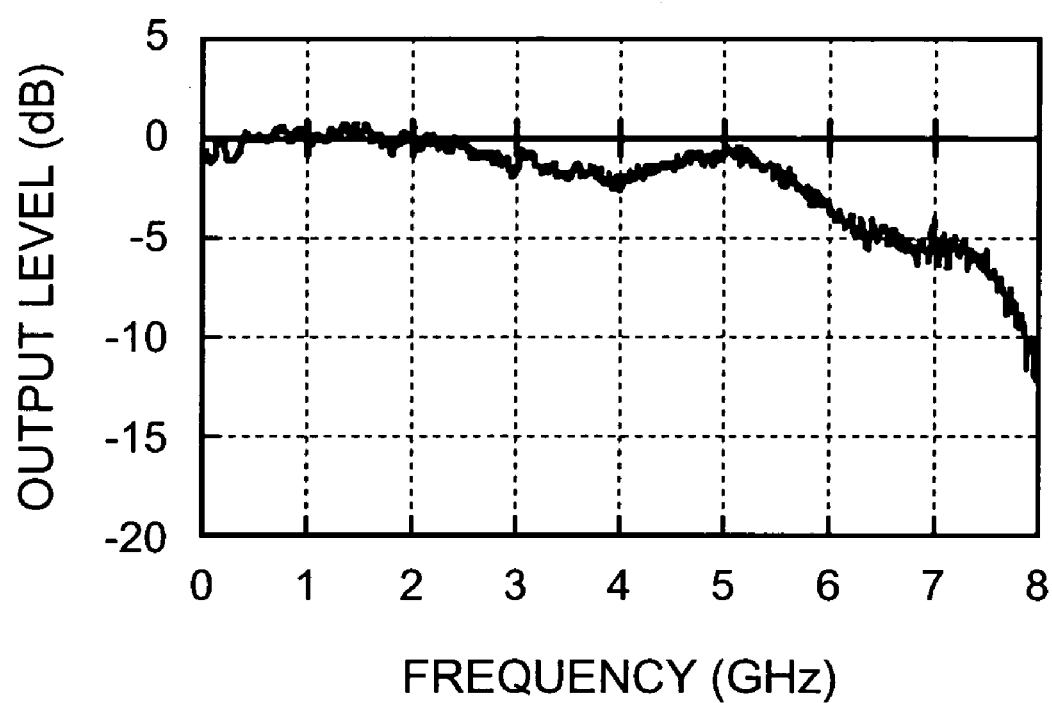
FIG. 5 is a graph showing an example of the frequency response characteristic of the semiconductor light-receiving device in accordance with the first embodiment.

Characteristics of a p-i-n type PD (having a light-receiving part with a diameter of 40 μm and a light-absorbing layer with a thickness of 2.4 μm) as the semiconductor light-receiving device 1 actually produced by using GaAs will now be illustrated. FIG. 3 is a graph showing the capacitance-backward voltage characteristic. As shown in FIG. 3, the semiconductor light-receiving device 1 yields a low-capacitance characteristic of 0.16 pF at a backward voltage of 2 V. FIG. 4 shows the response electric output waveform obtained when an optical pulse is inputted. As shown in FIG. 4, a response time of about 50 to 60 ps is obtained at a bias voltage of 2 V. FIG. 5 is a graph showing the frequency characteristic at a bias voltage of 2 V. As shown in FIG. 5, a cutoff frequency of about 6 GHz is obtained at −3 dB. The cutoff frequency inherent in the sample is assumed to be higher, since the data shown in FIG. 5 is limited by the measurement system.

As explained in the foregoing, the semiconductor light-receiving device 1 in accordance with the first embodiment is configured as a p-i-n type PD having a selective embedding structure in which three kinds of semiconductor layers are epitaxially grown only in the recess 16 of the semi-insulating GaAs substrate 2 formed by etching. Consequently, a low-capacitance semiconductor light-receiving device in which both p-side and n-side wiring electrodes without bumps are disposed on the semi-insulating GaAs substrate 2 can be obtained without using the special technique of concurrently etching back the semiconductor and a material such as photoresist having totally different characteristics at the same rate in the step of exposing the p-type GaAs layer 3. Since the wiring electrodes are disposed over the flat face having no steps with respect to the semi-insulating substrate, a semiconductor light-receiving device which is less likely to yield the disconnection and poor insulation due to the decrease of the coverage can be made. As a result, a semiconductor light-receiving device with improved yield and reproducibility can be realized easily at a low cost.

There is usually a limit to the lowering of capacitance, since the capacitance of bonding pad and wiring cannot be reduced no matter how small the diameter of the light-receiving part is. In this regard, the semiconductor light-receiving device 1 in accordance with this embodiment can suppress the increase in capacitance due to the constitutional parts (e.g., bonding pad and wiring) other than the light-receiving part to substantially zero. This reduces the CR time constant, thereby realizing a high-speed response. In particular, when connecting the semiconductor light-receiving device 1 to a downstream electric signal processing circuit such as an impedance converting circuit, the input capacitance from this circuit can effectively be minimized.

The semiconductor light-receiving device 1 in accordance with this embodiment is suitable for mass production, since it is simple in structure and relatively easy to manufacture.

In the semiconductor light-receiving device 1 in accordance with this embodiment, the ohmic electrode 7 in contact with the lower semiconductor layer 3 is formed around the mesa and thus is distanced farther from the central portion of the mesa, which is the operating region. Since such a structure may increase the series resistance, a p-type semiconductor layer (GaAs layer) 3 with a high carrier concentration is used as the lower semiconductor layer. This allows an external voltage source to provide a sufficient electric field to the mesa part, thereby stabilizing the operation. This can also reduce the series resistance for the external output of electric signals.

The configuration of the semiconductor light-receiving device 1 yielding the effects mentioned above can be advantageously used in light-receiving devices for high-speed optical communications which require low capacitance in particular.

This embodiment takes GaAs as an example of the material of the semi-insulating substrate and the semiconductor layers; however, the material is not limited to GaAs. For example, not only III–V family semiconductors such as InP, InGaAs and InAs, but also compound semiconductors such as ZnS and SiC can be used as needed. Single-element semiconductors such as Si and Ge may be used as well. The semi-insulating substrate and the semiconductor layers may be a heterojunction structure of different kinds of semiconductors. The impurities (donors) doped into the n-type semiconductor may be Se, Si, P or the like, and the impurities (acceptors) doped into the p-type semiconductor may be Zn, Mg, B or the like.

In the following, other embodiments which are the modified modes of the present invention will be described with reference to FIGS. 6 to 10. Since the basic configuration of the semiconductor light-receiving devices in accordance with these embodiments is the same as that of the semiconductor light-receiving device explained in detail in the first embodiment, the constituents identical to those of the first embodiment will be represented using the same numerals without repeating their explanations, and only the differences from the first embodiment will be explained.

Figure 10:
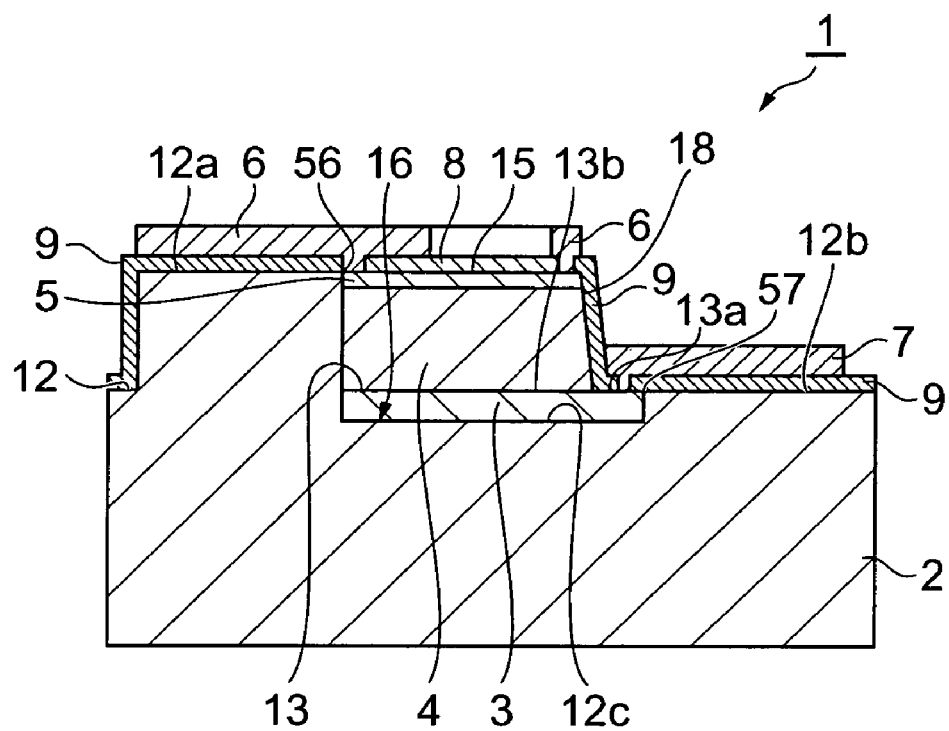
FIG. 10 is a sectional view showing a modified embodiment.

Referring to FIG. 10, in the top surface 13 of the p-type GaAs layer 3, the second portion 13b may be substantially on a level with the first portion 13a. In other words, the top surface 13 may be a single flat face.

Second Embodiment

Figure 6A:
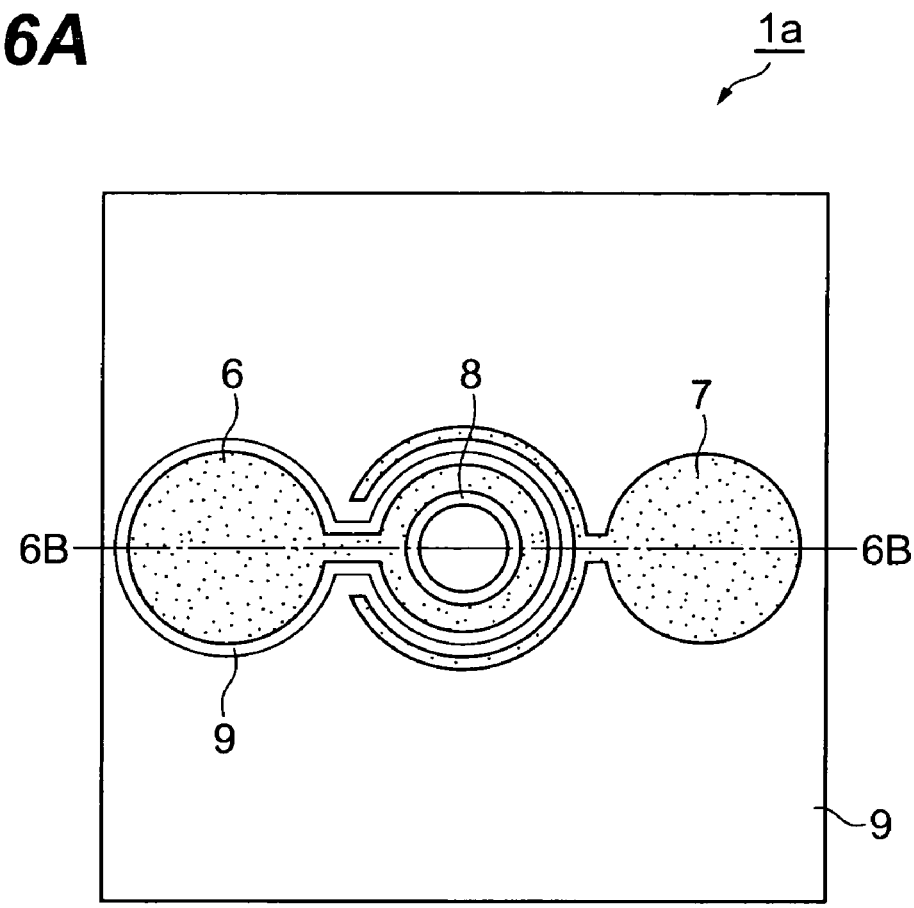
FIG. 6A is a top plan view of the semiconductor light-receiving device in accordance with the second embodiment of the present invention.
Figure 6B:
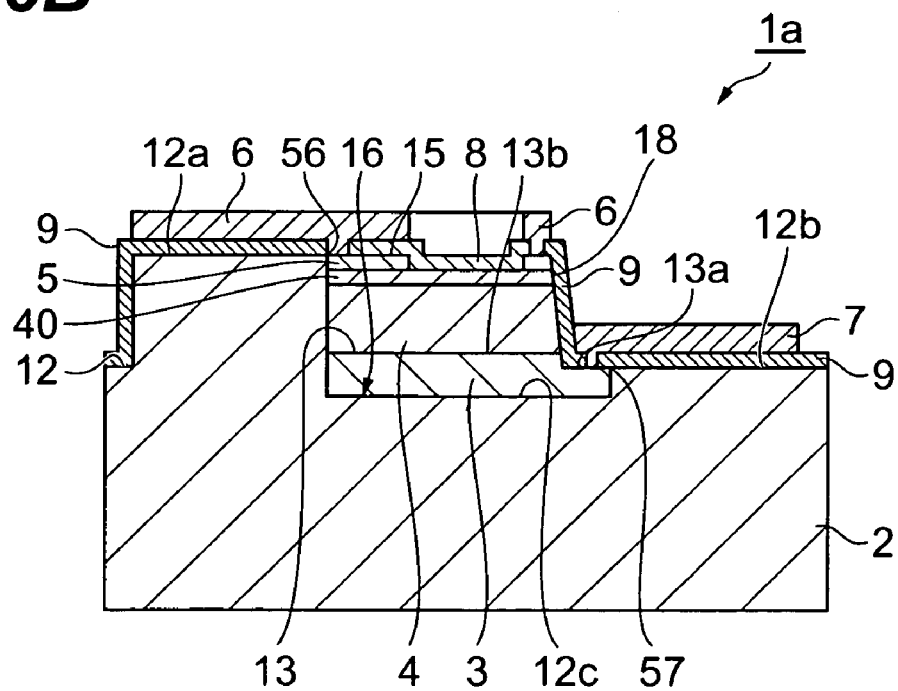
FIG. 6B is a sectional view taken along line 6B—6B in FIG. 6A.

Referring to FIGS. 6A and 6B, the second embodiment of the present invention will now be explained. FIG. 6A is a schematic top plan view of the semiconductor light-receiving device 1a in accordance with the second embodiment, and FIG. 6B is a schematic sectional view taken along line 6B—B in FIG. 6A. This embodiment differs from the first embodiment in that a window layer 40 is provided between the i-type GaAs layer 4 and n-type GaAs layer 5. Namely, after the p-type GaAs layer 3 and the i-type GaAs layer 4 (light-absorbing layer) are grown, the AlGaAs layer 40 (window layer) is grown in the recess 16 of the semi-insulating GaAs substrate 2. Thereafter, the n-type GaAs layer 5 is grown on top of the AlGaAs layer 40.

Preferably, the p-type GaAs layer 3, i-type GaAs layer 4, AlGaAs layer 40, and n-type GaAs layer 5 have thicknesses of about 1 µm, 2 µm, 0.5 µm, and 0.05 µm, respectively, when the recess 16 has a depth of about 3.5 µm, for example. For instance, the AlGaAs layer 40 is of n-type and has a carrier concentration of $1 \times 10^{17}$ cm$^{-3}$ or greater, whereas its Al crystal mixing ratio is 30%. Alternatively, the AlGaAs layer 40 may be of i-type. The AlGaAs layer 40 has an energy bandgap greater than that of the i-type GaAs layer 4.

A portion of the n-type GaAs layer 5 is selectively etched away so as to expose the AlGaAs layer 40 to receive incident light. Thereafter, as in the first embodiment, the crystal-growing layers 3, 4, 5 and the semi-insulating GaAs substrate 2 are partly etched so that the p-type GaAs layer 3 is partly exposed, and the etched structure is coated with the antireflection film 8 and insulating film 9 and then the n-side ohmic electrode 6 and p-side ohmic electrode 7 are formed. As a result, the semiconductor light-receiving device 1a attains the structure shown in FIG. 6B. In such a structure, the incident light does not pass through the n-type GaAs layer 5, but pass through the AlGaAs layer 40, which is transparent to near-infrared light, to reach the i-type GaAs layer 4. Therefore, the n-type GaAs layer 5 can be formed thick and also the light-receiving sensitivity can be improved.

Figure 7A:
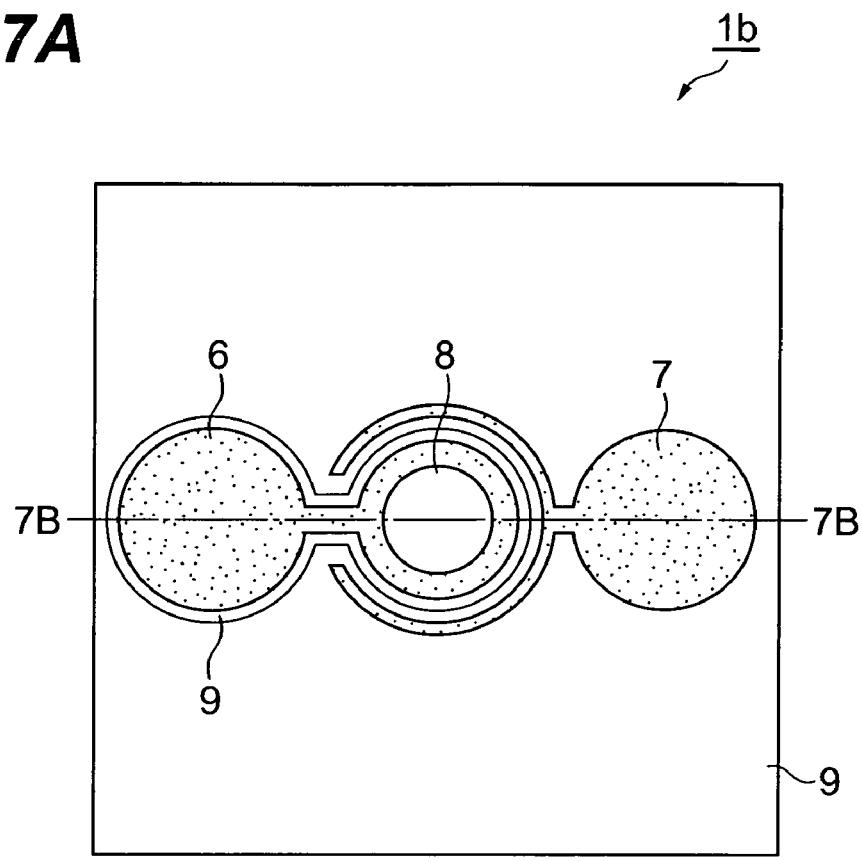
FIG. 7A is a top plan view of the semiconductor light-receiving device in accordance with a modified mode of the second embodiment.
Figure 7B:
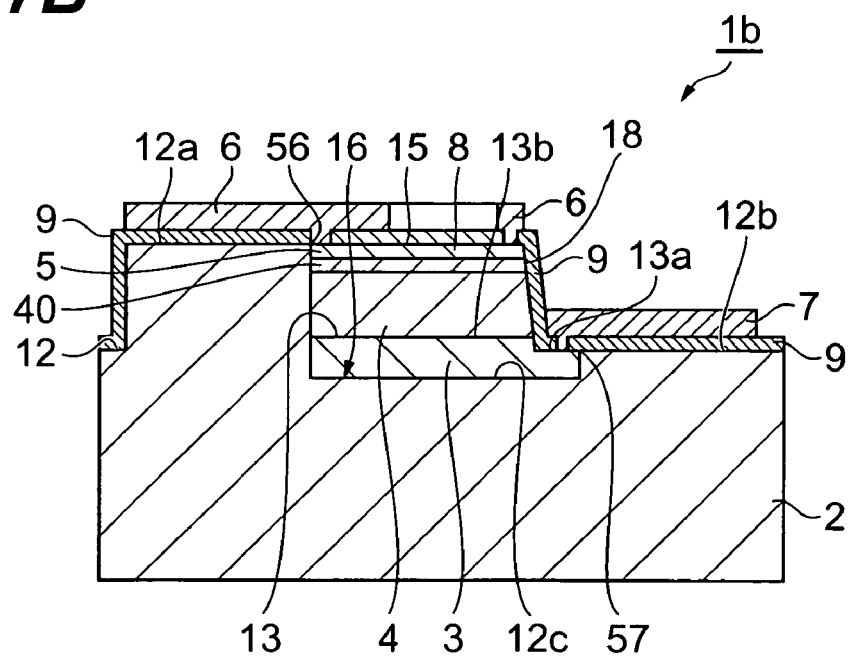
FIG. 7B is a sectional view taken along line 7B—7B in FIG. 7A.

In the semiconductor light-receiving device 1a in accordance with the second embodiment, the n-type GaAs layer 5 is etched away except for the portion in contact with the ohmic electrode, so as to form an opening and partly expose the surface of the AlGaAs layer 40. However, the n-type GaAs layer 5 may be left when formed so thin that a required light-receiving sensitivity can be obtained. FIGS. 7A and 7B show the structure of the semiconductor light-receiving device 1b where the n-type GaAs layer 5 is not etched.

Third Embodiment

Figure 8A:
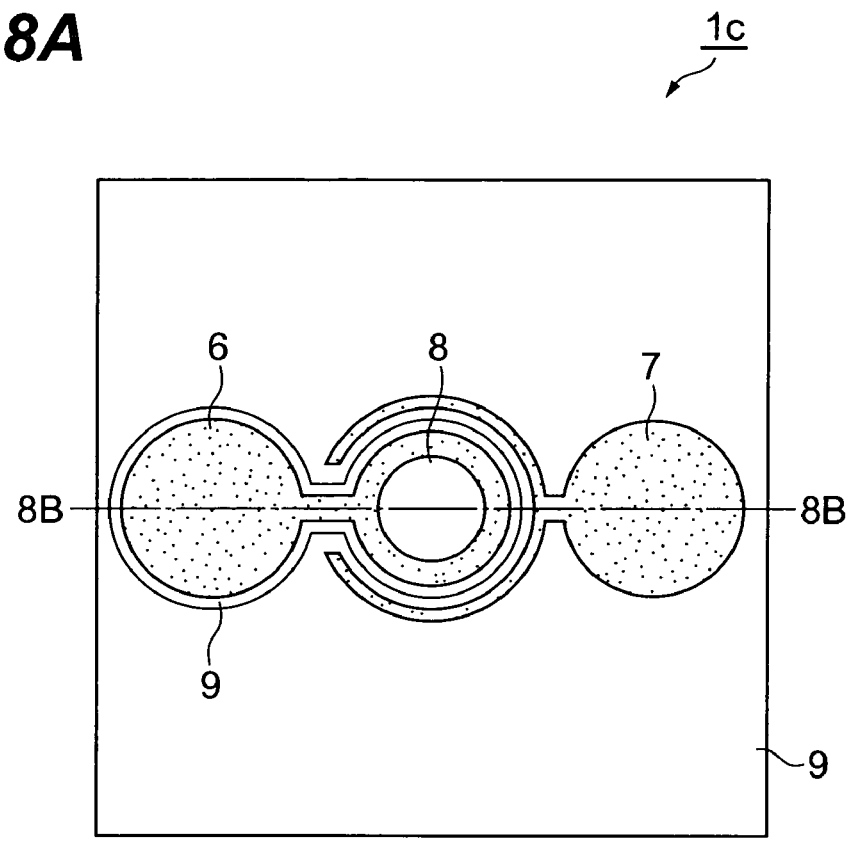
FIG. 8A is a top plan view of the semiconductor light-receiving device in accordance with the third embodiment of the present invention.
Figure 8B:
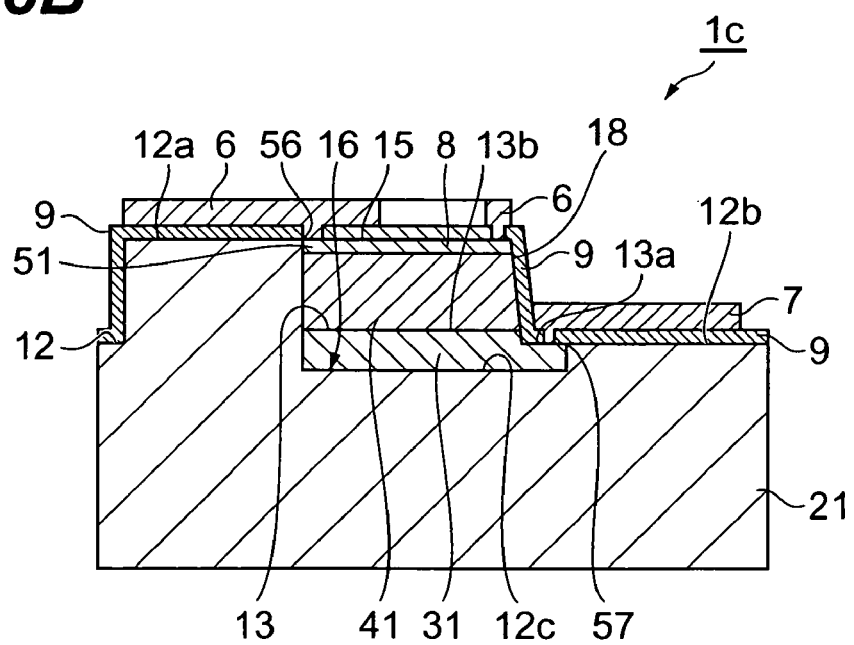
FIG. 8B is a sectional view taken along line 8B—8B in FIG. 8A.

FIG. 8A is a schematic top plan view of the semiconductor light-receiving device 1c in accordance with the third embodiment of the present invention, and FIG. 8B is a schematic sectional view taken along line 8B—8B in FIG. 8A. The semiconductor light-receiving device 1c differs from the semiconductor light-receiving device 1 of the first embodiment in the composition. Namely, a semi-insulating InP substrate 21 is used as the semi-insulating substrate in this embodiment. As semiconductor layers, a p-type $In_xGa_{1-x}As_yP_{1-y}$ layer 31 with a thickness of 1 µm, an i-type InGaAs layer 41 with a thickness of 2 µm, and an n-type $In_xGa_{1-x}As_yP_{1-y}$ layer 51 with a thickness of 0.05 µm are grown successively from the lower layer. Here, $0 \leq x \leq 1$, and $0 \leq y \leq 1$. $In_xGa_{1-x}As_yP_{1-y}$ layer 51 can act as a window layer because it can attain an energy bandgap greater than that of InGaAs by choosing the crystal mixing ratios x and y. This improves the light-receiving sensitivity of the semiconductor light-receiving device 1c.

Fourth Embodiment

Figure 9A:
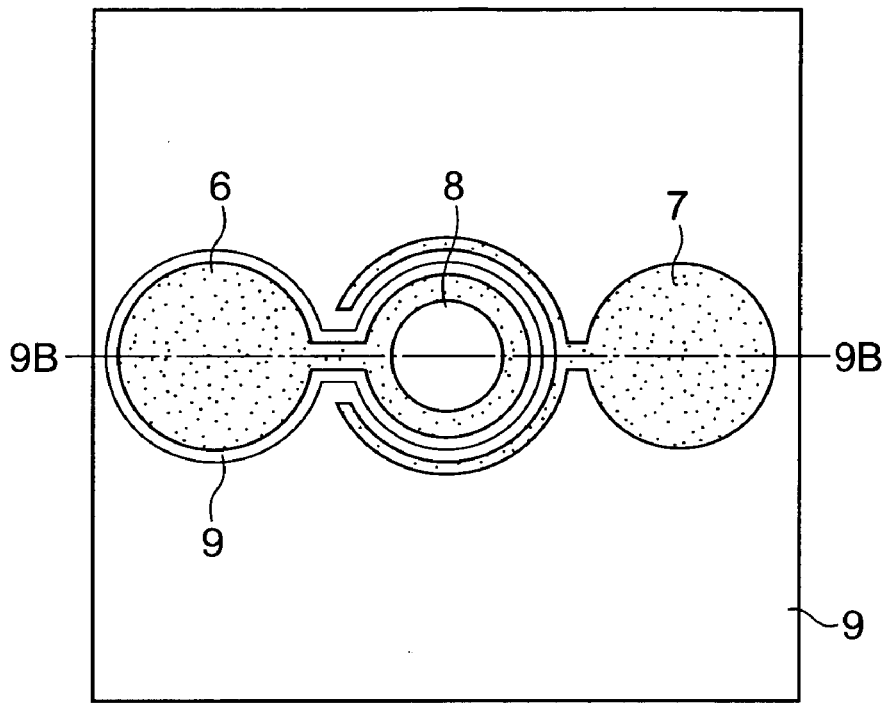
FIG. 9A is a top plan view of the semiconductor light-receiving device in accordance with the fourth embodiment of the present invention.
Figure 9B:
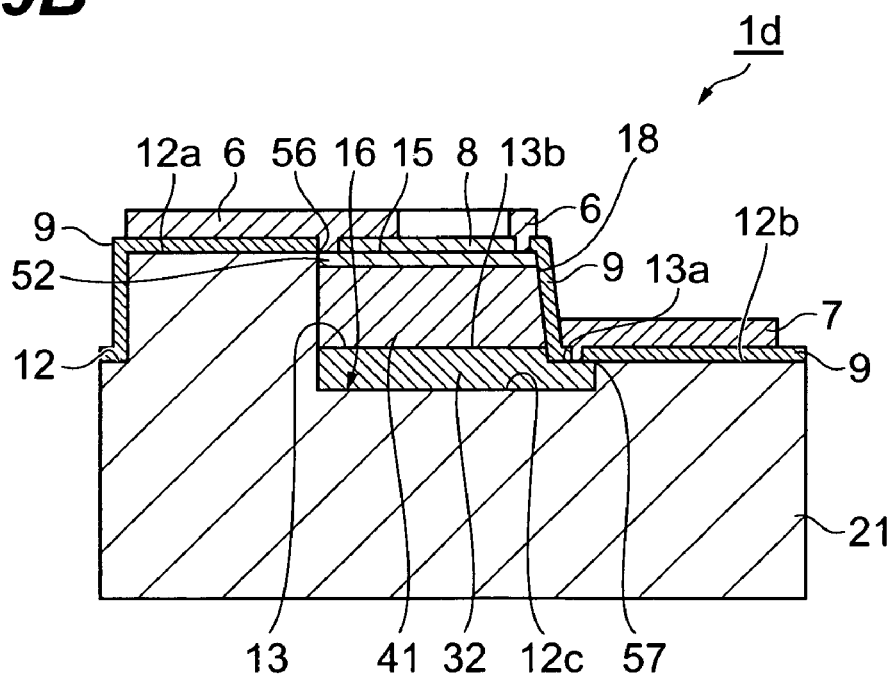
FIG. 9B is a sectional view taken along line 9B—9B in FIG. 9A.

FIG. 9A is a schematic top plan view of the semiconductor light-receiving device 1d in accordance with the fourth embodiment of the present invention, and FIG. 9B is a schematic sectional view taken along line 9B—9B in FIG. 9A. The semiconductor light-receiving device 1d differs from the semiconductor light-receiving devices of the first and third embodiments in the composition. This embodiment is the same as the third embodiment in that the semi-insulating InP substrate 21 and the InGaAs layer 41 are used as the semi-insulating substrate and i-type semiconductor layer, respectively. However, a p-type InAlAs layer 32 is used as the p-type semiconductor layer, and an n-type InAlAs layer 52 as the n-type semiconductor layer. InAlAs layer 52 acts as a window layer because its energy bandgap is greater than that of InGaAs. This improves the light-receiving sensitivity of the semiconductor light-receiving device 1d.

Without being restricted to the modes set forth in the above-mentioned embodiments, the semiconductor light-receiving device in accordance with the present invention can be modified as appropriate within the range not deviating from the gist of the present invention. For example, the circular portions 6a and 7a of the n-side and p-side ohmic electrodes 6 and 7 are disposed at the opposite sides of the recess 16 in the above embodiments, as shown in FIG. 1A; however, the circular portions 6a and 7a may be arranged so that the lines extending from the centers of the circular portions 6a and 7a to the center of the recess 16 form a predetermined angle (e.g., 90°) therebetween when viewed from the top. Moreover, the planar shapes of the recess 16 and the electrodes 6 and 7 are not limited to the circular ones described above; they may be any other shape such as rectangle.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A semiconductor light-receiving device comprising:
a semi-insulating substrate having a front side including upper, middle and lower regions, the lower region being connected to the upper and middle regions;
a p-type first semiconductor layer provided on the lower region, the first semiconductor layer having a top surface including a first portion adjoining and substantially on a level with the middle region, and a second portion on a level with or above the first portion;
an n-type second semiconductor layer provided on the first semiconductor layer, the second semiconductor layer having a top surface including a third portion adjoining and substantially on a level with the upper region, and a bottom surface;
a first electrode covering at least part of a boundary between the middle region and the first portion, the first electrode being electrically in contact with the first semiconductor layer; and
a second electrode covering at least part of a boundary between the upper region and the third portion, the second electrode being electrically in contact with the second semiconductor layer,
wherein the semi-insulating substrate is made of semi-insulating GaAs;
wherein the first semiconductor layer is made of p-type GaAs; and
wherein the second semiconductor layer is made of n-type GaAs.

2. A semiconductor light-receiving device comprising:
a semi-insulating substrate having a front side including upper, middle and lower regions, the lower region being connected to the upper and middle regions;
a p-type first semiconductor layer provided on the lower region, the first semiconductor layer having a top surface including a first portion adjoining and substantially on a level with the middle region, and a second portion on a level with or above the first portion;
an n-type second semiconductor layer provided on the first semiconductor layer, the second semiconductor layer having a top surface including a third portion adjoining and substantially on a level with the upper region, and a bottom surface;
a first electrode covering at least part of a boundary between the middle region and the first portion, the first electrode being electrically in contact with the first semiconductor layer; and
a second electrode covering at least part of a boundary between the upper region and the third portion, the second electrode being electrically in contact with the second semiconductor layer,
wherein the semi-insulating substrate is made of semi-insulating InP;
wherein the first semiconductor layer is made of p-type $In_xGa_{1-x}As_yP_{1-y}$ ($0 \leq x \leq 1$, $0 \leq y \leq 1$); and
wherein the second semiconductor layer is made of n-type $In_xGa_{1-x}As_yP_{1-y}$ ($0 \leq x \leq 1$, $0 \leq y \leq 1$).

3. A semiconductor light-receiving device comprising:
a semi-insulating substrate having a front side including upper, middle and lower regions, the lower region being connected to the upper and middle regions;
a p-type first semiconductor layer provided on the lower region, the first semiconductor layer having a top surface including a first portion adjoining and substantially on a level with the middle region, and a second portion on a level with or above the first portion;
an n-type second semiconductor layer provided on the first semiconductor layer, the second semiconductor layer having a top surface including a third portion adjoining and substantially on a level with the upper region, and a bottom surface;
a first electrode covering at least part of a boundary between the middle region and the first portion, the first electrode being electrically in contact with the first semiconductor layer;
a second electrode covering at least part of a boundary between the upper region and the third portion, the second electrode being electrically in contact with the second semiconductor layer; and
a third semiconductor layer interposed between the second portion of the first semiconductor layer and the bottom surface of the second semiconductor layer, the third semiconductor layer having a carrier concentration lower than those of the first and second semiconductor layers, wherein the semi-insulating substrate is made of semi-insulating GaAs;

wherein the first semiconductor layer is made of p-type GaAs;

wherein the second semiconductor layer is made of n-type GaAs; and wherein the third semiconductor layer is made of i-type GaAs.

4. A semiconductor light-receiving device comprising:

a semi-insulating substrate having a front side including upper, middle and lower regions, the lower region being connected to the upper and middle regions;

a p-type first semiconductor layer provided on the lower region, the first semiconductor layer having a top surface including a first portion adjoining and substantially on a level with the middle region, and a second portion on a level with or above the first portion;

an n-type second semiconductor layer provided on the first semiconductor layer, the second semiconductor layer having a top surface including a third portion adjoining and substantially on a level with the upper region, and a bottom surface;

a first electrode covering at least part of a boundary between the middle region and the first portion, the first electrode being electrically in contact with the first semiconductor layer;

a second electrode covering at least part of a boundary between the upper region and the third portion, the second electrode being electrically in contact with the second semiconductor layer;and a third semiconductor layer interposed between the second portion of the first semiconductor layer and the bottom surface of the second semiconductor layer, the third semiconductor layer having a carrier concentration lower than those of the first and second semiconductor layers, wherein the semi-insulating substrate is made of semi-insulating InP;

wherein the first semiconductor layer is made of p-type $In_xGa_{1-x}As_yP_{1-y}$ ($0 \leq x \leq 1$, $0 \leq y \leq 1$);

wherein the second semiconductor layer is made of n-type $In_xGa_{1-x}As_yP_{1-y}$ ($0 \leq x \leq 1$, $0 \leq y \leq 1$); and wherein the third semiconductor layer is made of i-type InGaAs.

5. A semiconductor light-receiving comprising:

a semi-insulating substrate having a front side including upper, middle and lower regions, the lower region being connected to the upper and middle regions;

a p-type first semiconductor layer provided on the lower region, the first semiconductor layer having a top surface including a first portion adjoining and substantially on a level with the middle region, and a second portion on a level with or above the first portion;

an n-type second semiconductor layer provided on the first semiconductor layer, the second semiconductor layer having a top surface including a third portion adjoining and substantially on a level with the upper region, and a bottom surface;

a first electrode covering at least part of a boundary between the middle region and the first portion, the first electrode being electrically in contact with the first semiconductor layer;

a second electrode covering at least part of a boundary between the upper region and the third portion, the second electrode being electrically in contact with the second semiconductor layer; and a third semiconductor layer interposed between the second portion of the first semiconductor layer and the bottom surface of the second semiconductor layer, the third semiconductor layer having a carrier concentration lower than those of the first and second semiconductor layers, wherein the semi-insulating substrate is made of semi-insulating InP;

wherein the first semiconductor layer is made of p-type InAlAs;

wherein the second semiconductor layer is made of n-type InAlAs; and wherein the third semiconductor layer is made of i-type InGaAs.

6. A semiconductor light-receiving device comprising:

a semi-insulating substrate having a front side including upper, middle and lower regions, the lower region being connected to the upper and middle regions;

a p-type first semiconductor layer provided on the lower region, the first semiconductor layer having a top surface including a first portion adjoining and substantially on a level with the middle region, and a second portion on a level with or above the first portion;

an n-type second semiconductor layer provided on the first semiconductor layer, the second semiconductor layer having a top surface including a third portion adjoining and substantially on a level with the upper region, and a bottom surface;

a first electrode covering at least part of a boundary between the middle region and the first portion, the first electrode being electrically in contact with the first semiconductor layer;

a second electrode covering at least part of a boundary between the upper region and the third portion, the second electrode being electrically in contact with the second semiconductor layer;

a third semiconductor layer interposed between the second portion of the first semiconductor layer and the bottom surface of the second semiconductor layer, the third semiconductor layer having a carrier concentration lower than those of the first and second semiconductor layers; and a fourth semiconductor layer interposed between the second and third semiconductor layers, the fourth semiconductor layer having an energy bandgap greater than that of the third semiconductor layer.

7. A semiconductor light-receiving device according to claim 6, wherein the semi-insulating substrate is made of semi-insulating GaAs;

wherein the first semiconductor layer is made of p-type GaAs;

wherein the second semiconductor layer is made of n-type GaAs;

wherein the third semiconductor layer is made of i-type GaAs; and wherein the fourth semiconductor layer is made of i-type or n-type AlGaAs.

8. A semiconductor light-receiving device comprising:

a semi-insulating substrate having a front side including upper, middle and lower regions, the lower region being connected to the upper and middle regions;

a p-type first semiconductor layer provided on the lower region, the first semiconductor layer having a top surface including a first portion adjoining and substantially on a level with the middle region, and a second portion on a level with or above the first portion;

an n-type second semiconductor layer provided on the first semiconductor layer, the second semiconductor layer having a top surface including a third portion adjoining and substantially on a level with the upper region, and a bottom surface;

a first electrode covering at least part of a boundary between the middle region and the first portion, the first electrode being electrically in contact with the first semiconductor layer; and a second electrode covering at least part of a boundary between the upper region and the third portion, the second electrode being electrically in contact with the second semiconductor layer, wherein the middle region and the first portion are connected to form a flat face.

9. A semiconductor light-receiving device comprising:

a semi-insulating substrate having a front side including upper, middle and lower regions, the lower region being connected to the upper and middle regions;

a p-type first semiconductor layer provided on the lower region, the first semiconductor layer having a top surface including a first portion adjoining and substantially on a level with the middle region, and a second portion on a level with or above the first portion;

an n-type second semiconductor layer provided on the first semiconductor layer, the second semiconductor layer having a top surface including a third portion adjoining and substantially on a level with the upper region, and a bottom surface;

a first electrode covering at least part of a boundary between the middle region and the first portion, the first electrode being electrically in contact with the first semiconductor layer; and a second electrode covering at least part of a boundary between the upper region and the third portion, the second electrode being electrically in contact with the second semiconductor layer, wherein the upper region and the third portion are connected to form a flat face.

* * * * *